(12) United States Patent
Boon et al.

(10) Patent No.: US 9,519,230 B2
(45) Date of Patent: Dec. 13, 2016

(54) MAGNETIC DEVICE AND LITHOGRAPHIC APPARATUS

(71) Applicant: ASML Netherlands B.V., Veldhoven (NL)

(72) Inventors: Fidelus Adrianus Boon, Bavel (NL); Olof Martinus Josephus Fischer, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 27 days.

(21) Appl. No.: 14/415,518

(22) PCT Filed: Jun. 18, 2013

(86) PCT No.: PCT/EP2013/062629
§ 371 (c)(1),
(2) Date: Jan. 16, 2015

(87) PCT Pub. No.: WO2014/012729
PCT Pub. Date: Jan. 23, 2014

(65) Prior Publication Data
US 2015/0212430 A1    Jul. 30, 2015

Related U.S. Application Data

(60) Provisional application No. 61/673,054, filed on Jul. 18, 2012.

(51) Int. Cl.
*G03B 27/58* (2006.01)
*G03F 7/20* (2006.01)
*H01F 7/02* (2006.01)

(52) U.S. Cl.
CPC ....... *G03F 7/70716* (2013.01); *G03F 7/70758* (2013.01); *G03F 7/70816* (2013.01); *H01F 7/0252* (2013.01)

(58) Field of Classification Search
CPC ................. G03F 7/70716; G03F 7/70758
(Continued)

(56) References Cited

U.S. PATENT DOCUMENTS

| 6,437,864 B1 | 8/2002 | Watanabe et al. |
| 6,831,285 B2 | 12/2004 | Hol et al. |

(Continued)

FOREIGN PATENT DOCUMENTS

| CN | 102200689 | 9/2011 |
| JP | 2005-109475 | 4/2005 |

(Continued)

OTHER PUBLICATIONS

Chinese Office Action mailed Nov. 3, 2015 in corresponding Chinese Patent Application No. 2013800375966.
(Continued)

*Primary Examiner* — Hung Henry Nguyen
(74) *Attorney, Agent, or Firm* — Pillsbury Winthrop Shaw Pittman LLP (57) ABSTRACT

A magnetic device includes first and second parts, a first magnetic part, with a first magnetic polarization, coupled to the first part, a second magnetic part, with a second magnetic polarization, coupled to the second part and an additional magnetic part coupled to the first part and having an additional magnetic polarization. The first and second magnetic parts magnetically interact with each other. The first magnetic part exerts a first force on the second magnetic part, the second magnetic part exerts a second force on the first magnetic part and the first and second forces have opposite directions that are parallel to a reference direction. The first magnetic polarization is substantially parallel to the reference direction, the second magnetic polarization is substantially perpendicular to the reference direction, the additional magnetic polarization makes an angle with the first magnetic (Continued)

polarization and has a magnitude in a range of about 90°-270°.

10 Claims, 7 Drawing Sheets

(58) Field of Classification Search
USPC .......................... 355/53, 72–76; 310/10, 12
See application file for complete search history.

(56) References Cited

U.S. PATENT DOCUMENTS

| | | | |
|---|---|---|---|
| 6,885,117 B2* | 4/2005 | De Weerdt | G03F 7/70758 310/12.32 |
| 6,952,253 B2 | 10/2005 | Lof et al. | |
| 7,259,832 B2 | 8/2007 | Dams | |
| 2003/0052284 A1 | 3/2003 | Hol et al. | |
| 2004/0135468 A1 | 7/2004 | De Weerdt et al. | |
| 2004/0207824 A1 | 10/2004 | Lof et al. | |
| 2005/0094118 A1 | 5/2005 | Dams | |
| 2006/0061219 A1 | 3/2006 | Hazelton | |
| 2008/0266037 A1* | 10/2008 | Williams | G03F 7/70716 335/219 |
| 2011/0267596 A1 | 11/2011 | Muehlberger et al. | |
| 2013/0076467 A1 | 3/2013 | Compter et al. | |

FOREIGN PATENT DOCUMENTS

| | | |
|---|---|---|
| JP | 2008-306836 | 12/2008 |
| WO | 2010/066873 | 6/2010 |
| WO | 2011/131462 | 10/2011 |

OTHER PUBLICATIONS

Japanese Office Action mailed Feb. 5, 2016 in corresponding Japanese Patent Application No. 2015-522011.
International Search Report mailed Sep. 18, 2013 in corresponding International Patent Application No. PCT/EP2013/062629.
Disclosed Anonymously, "Magnetic gravity compensator with integrated Lorentz actuator and flux steering permanent magnet poles," Research Disclosure, Mason Publications, Hampshire, GB, vol. 557, No. 18, pp. 870-872 (Sep. 1, 2010).

* cited by examiner

Prior Art

MAGNETIC DEVICE AND LITHOGRAPHIC APPARATUS

CROSS-REFERENCE TO RELATED APPLICATIONS

This application is the U.S. national phase entry of International Patent Application No. PCT/EP2013/062629, filed Jun. 18, 2013, which claims the benefit of priority from U.S. provisional application 61/673,054, which was filed on Jul. 18, 2012, and which is incorporated herein in its entirety by reference.

FIELD

The present invention relates to a magnetic device and a lithographic apparatus comprising the magnetic device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. The patterning device may be supported by a patterning device support. The pattern can be transferred onto a target portion (e.g., including part of, one, or several dies) on a substrate (e.g., a silicon wafer) that may be supported by a substrate table. Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Figure 2A:
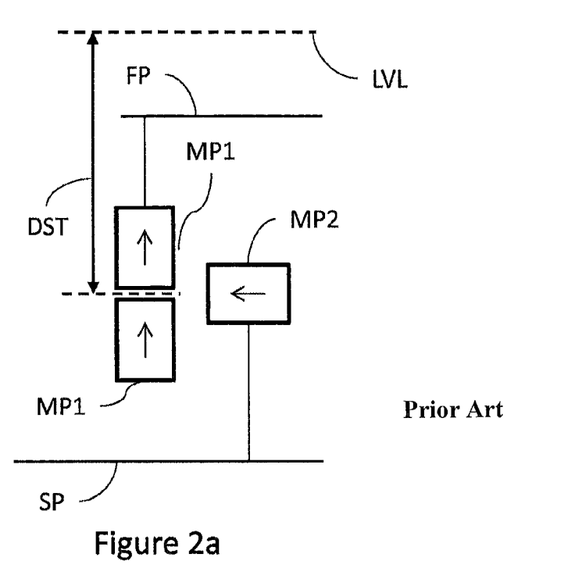
FIG. 2a depicts an magnetic device for use in the lithographic apparatus of FIG. 1 according to the prior art.

The lithographic apparatus may be provided with a magnetic device for providing a force in a reference direction between a first part of the magnetic device and a second part of the magnetic device. FIG. 2a depicts a known magnetic device for use in the lithographic apparatus. The magnetic device comprises a first magnetic part coupled to the first part and having a first magnetic polarization and a second magnetic part coupled to the second part and having a second magnetic polarization. The first magnetic part and the second magnetic part are configured to magnetically interact with each other. The first magnetic part exerts a first force on the second magnetic part and the second magnetic part exerts a second force on the first magnetic part. The first force and the second force may have opposite directions that are parallel to a reference direction. Note that magnetic polarization is a vector field, i.e. it has both direction and magnitude, therefore the addition 'direction' in relation to magnetic polarization is omitted. The first magnetic polarization is substantially parallel to the reference direction and may be directed in an upward direction (e.g., as indicated in the first magnetic part MP1 by the arrow). The second magnetic part may have a second magnetic polarization that is substantially perpendicular to the reference direction. The force between the first magnetic part MP1 and the second magnetic part MP2 may be used to compensate for a gravitational force. In such an embodiment the magnetic device may be suitable to be used as a so-called gravity compensator.

The first magnetic part MP1 may be connected to the substrate table to support against the gravitational force. The first magnetic part MP1 may be connected to a patterning device support (e.g., mask table MT) to support it against the gravitational force. The gravity compensator may be provided to other components of the lithographic apparatus (e.g., lens elements, metrology frame, stages and more in general each component that is passively and/or actively held at a desired position) to provide support against the gravitational force while, preferably, it also dynamically isolates the components of the lithographic apparatus from vibrations from the surrounding of the apparatus.

Figure 2B:
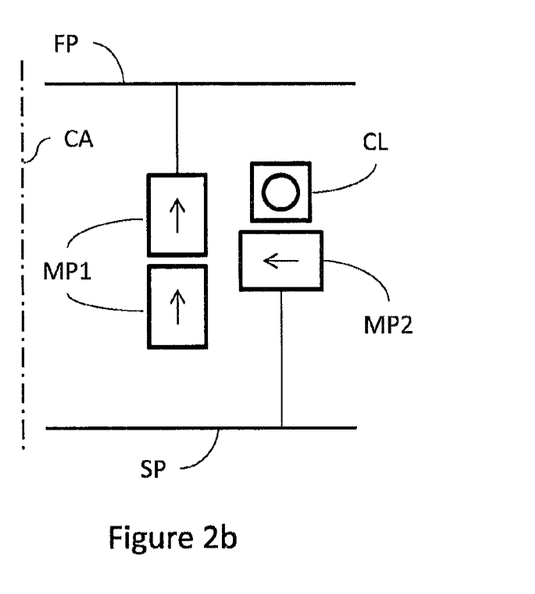
FIG. 2b depicts another magnetic device for use in the lithographic apparatus of FIG. 1 according to the prior art.

Electromagnetic devices (e.g., motors) in general can be characterized by a parameter known as 'motor constant'. This constant defines a relation between an electromagnetic device input and an electromagnetic device output, and in case of a Lorentz actuator the electromagnetic device input is usually a current carried by an electrically conductive element (e.g., a coil CL) and the electromagnetic device output is usually an exerted force as function of the current. FIG. 2b depicts another known electromagnetic device including an electrically conductive element for use in a lithographic apparatus. Most of the time, the value of the motor constant is assumed to be a constant, explaining the name 'motor constant'. Thus, when a person skilled in the art assumes the motor constant to be constant, he/she actually assumes the value of the motor constant to be the constant average portion. One of the possible causes for the variation of the value of the motor constant of a Lorentz actuator can be position dependency due to position dependent variations of the magnetic field strength and/or magnetization direction/orientation of the magnets.

Figure 3:
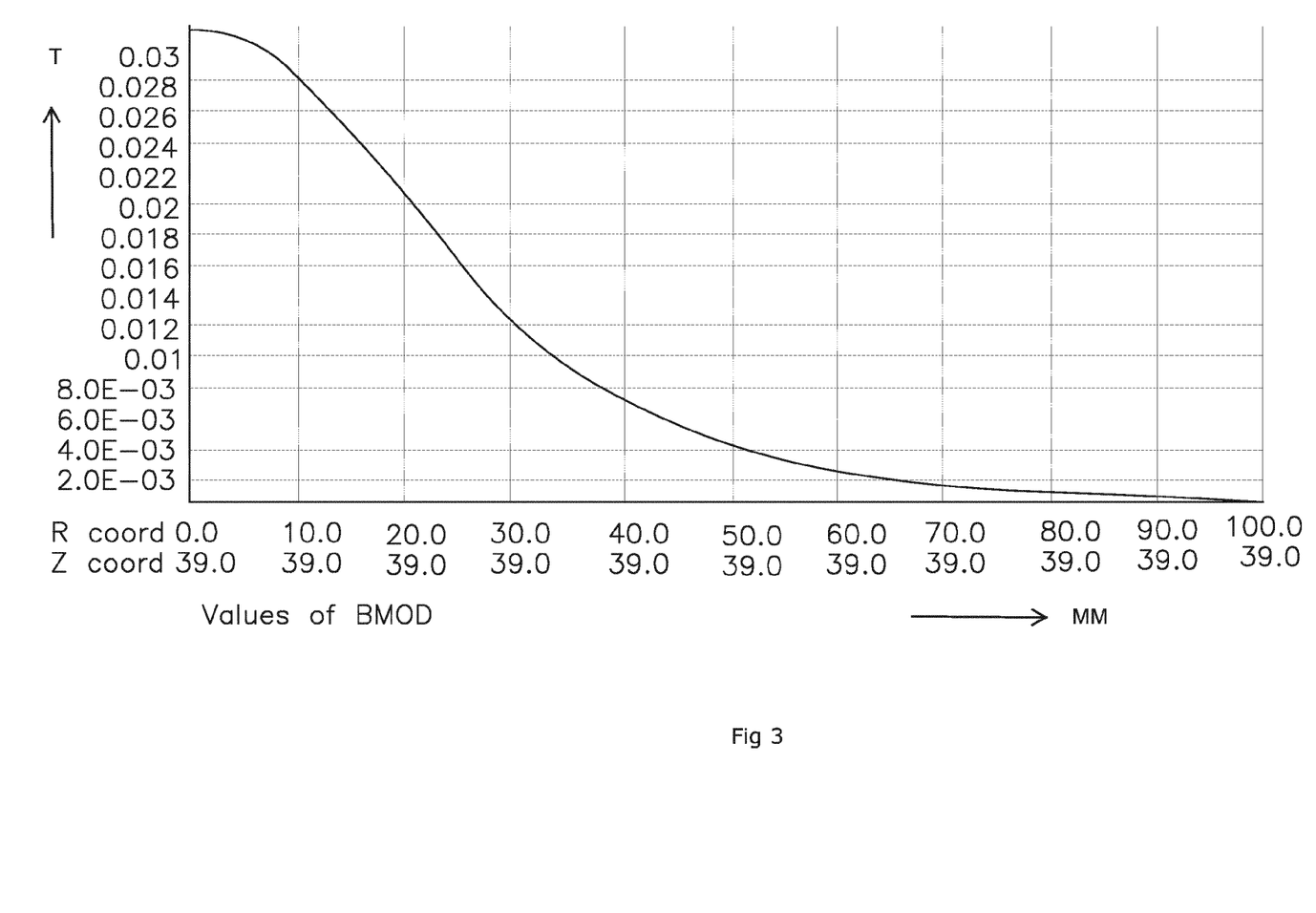
FIG. 3 depicts a graph of the strength of the magnetic field outside the magnetic device of FIG. 2a at a certain level.

The magnetic field caused by the magnetic interaction between the first magnetic part MP1 and the second magnetic part MP2 may extend outside the magnetic device and may disturb another part (e.g., another part of the lithographic apparatus). FIG. 3 depicts a graph of the strength of the magnetic field (in Tesla) outside the magnetic device of FIG. 2a at a fixed distance (DST) of 39 mm in z-direction above the gravity compensator (indicated as level LVL in FIG. 2a) and in dependency of the distance in R-direction (in millimeters) with respect to a center axis (being parallel to the reference direction) and extending through the center of the magnetic parts MP1. The maximum strength of the magnetic field outside the gravity compensator may be too high. Additionally the position dependency of the value of the motor constant of the magnetic device may also be too high.

SUMMARY

It is desirable to provide an improved magnetic device.

According to an embodiment, there is provided a magnetic device, comprising a first part, a second part, a first magnetic part coupled to the first part and having a first magnetic polarization, a second magnetic part coupled to the second part and having a second magnetic polarization and an additional magnetic part coupled to the first part and having an additional magnetic polarization, wherein the first magnetic part and the second magnetic part are configured to magnetically interact with each other, wherein: the first magnetic part exerts a first force on the second magnetic part, the second magnetic part exerts a second force on the first magnetic part and the first force and the second force have opposite directions that are parallel to a reference direction, the first magnetic polarization is substantially parallel to the reference direction, the second magnetic polarization is substantially perpendicular to the reference direction, the additional magnetic polarization makes an angle with the first magnetic polarization and the angle has a magnitude in a range of about 90° to about 270°.

In yet another embodiment, there is provided a lithographic apparatus comprising a support structure configured to support a patterning device, the patterning device configured to pattern a radiation beam to form a patterned beam of radiation, a substrate table configured to support a substrate, a projection system configured to project the patterned beam of radiation onto the substrate and a magnetic device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
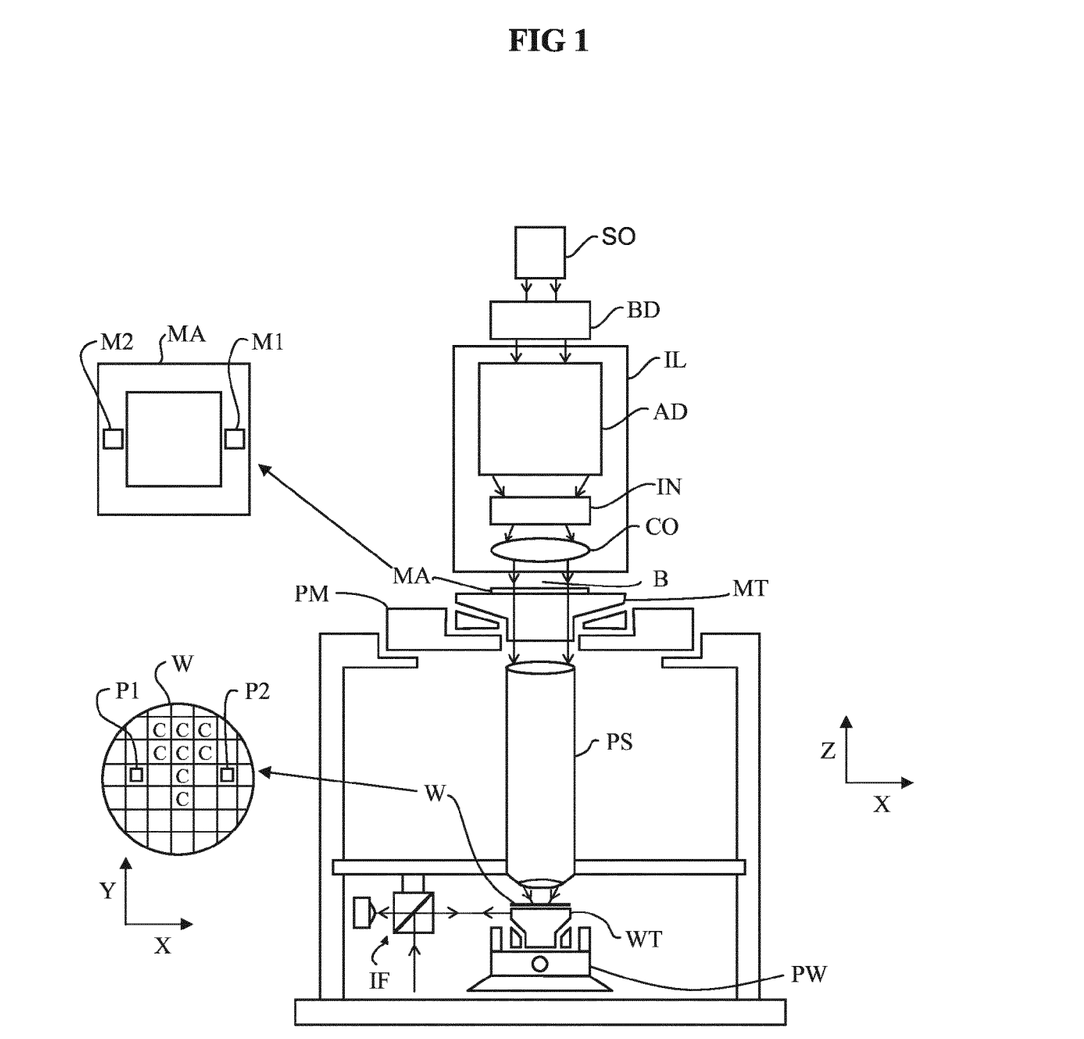
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the patterning device (e.g., mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

The radiation beam B is incident on the patterning device (e.g., mask) MA, which is held on the support structure (e.g., mask table) MT, and is patterned by the patterning device. Having traversed the patterning device (e.g., mask) MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the patterning device (e.g., mask) MA with respect to the path of the radiation beam B, e.g., after retrieval from a mask library, or during a scan. In general, movement of the support structure (e.g., mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Figure 4:
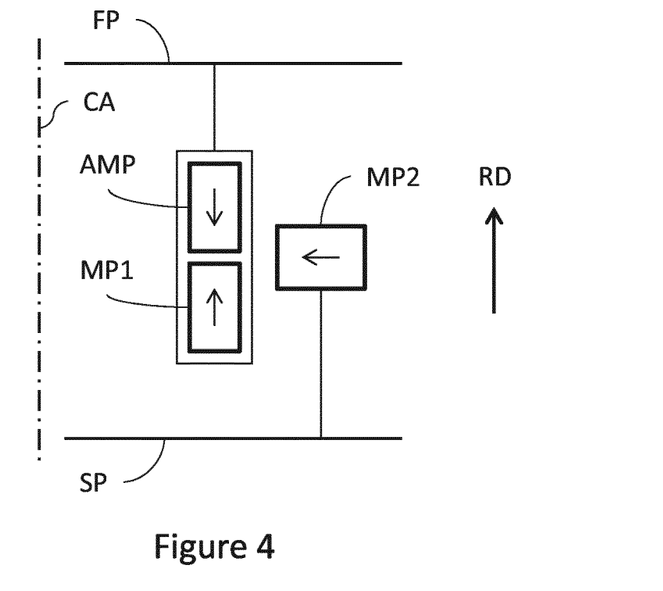
FIG. 4 depicts an magnetic device according to a first embodiment of the invention for use in the lithographic apparatus of FIG. 1.
Figure 5:
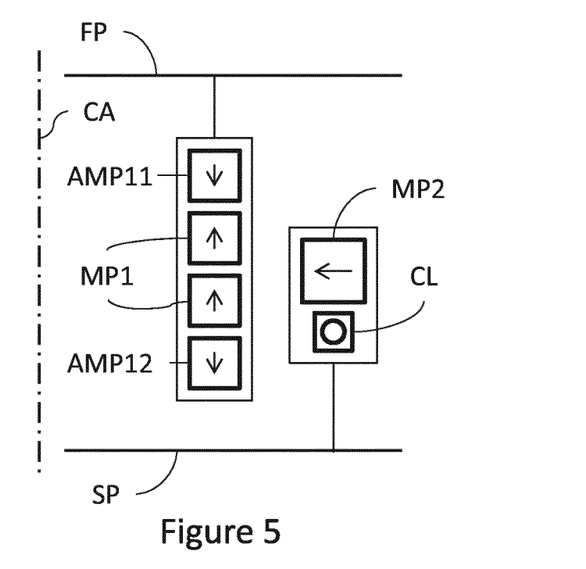
FIG. 5 depicts an magnetic device according to a second embodiment of the invention for use in the lithographic apparatus of FIG. 1.

FIG. 4 shows a magnetic device according to an embodiment of the invention. The magnetic device comprises a first magnetic part MP1 coupled to a first part FP of the magnetic device and having a first magnetic polarization that is substantially parallel to the reference direction RD and a second magnetic part MP2 coupled to a second part SP of the magnetic device and having a second magnetic polarization that is substantially perpendicular to the reference direction RD. The first magnetic part MP1 and the second magnetic part MP2 are configured to magnetically interact with each other wherein the first magnetic part MP1 exerts a first force on the second magnetic part MP2, the second magnetic part MP2 exerts a second force on the first magnetic part MP1 and the first force and the second force have opposite directions that are parallel to the reference direction RD. The magnetic device further comprises an additional magnetic part AMP having an additional magnetic polarization making an angle with the first magnetic polarization, the angle having a magnitude in range of about 90 to about 270 degrees (note that an angle of 180 degrees is shown in FIG. 4), wherein the additional magnetic part AMP is being coupled to the first part FP of the magnetic device. Placing the additional magnetic part AMP in such a way may provide a lower magnetic stray field outside the magnetic device as the additional magnetic part AMP reduces at least a part of the magnetic flux of the first magnetic part MP1 outside the magnetic device in the direction of the first part FP in comparison with known magnetic devices (as shown and described with reference to FIG. 2a and FIG. 2b). A further advantage of the additional magnetic part AMP according to the invention is that the flux density at the position of the second magnetic part MP2 is higher in comparison with known electromagnetic devices, resulting in increased forces in the reference direction between the first magnetic part MP1 and the second magnetic part MP2. Consequently a smaller (and lighter) first magnetic part MP1 may be used to exert a similar force compared with the known electromagnetic devices, possibly enabling reduction of the total weight of the magnetic device. Placing an additional magnetic part AMP above the first magnetic part MP1 in the reference direction towards the first part FP of the magnetic device according to the invention reduces the magnetic stray field near that outside of the first part FP of the magnetic device, whereas placing an additional magnetic device AMP below the first magnetic part MP1 in an opposite direction to the reference direction RD towards the second part SP of the magnetic device increases the flux density at the position of the second magnetic part MP2. However this also increases the magnetic stray field outside the magnetic device at the outside near the second part SP of the magnetic device. Additionally, it also possible to place two additional magnetic parts AMP11 and AMP12 (as shown in FIG. 5) to reduce the magnetic stray field outside the magnetic device near the outside of the first part FP of the magnetic device while increasing the flux density at the position of the second magnetic part MP2. In an embodiment an additional (radial) shielding may be used to decrease the levels of the magnetic stray field outside the magnetic device even further. In an embodiment an additional (radial) shielding may also be used to increase the levels of the magnetic field inside the magnetic device itself. In a preferred embodiment of the invention, the additional magnetic polarization has an angle of about 180 degrees with respect to the first magnetic polarization. In such an embodiment the magnetic stray field in the direction to the first part FP of the magnetic device is maximally reduced whereas the flux density at the position of the second magnetic part MP2 is maximally increased resulting in a more efficient magnetic device.

In a further embodiment of the invention, at least one of the first part FP of the magnetic device and the second part SP of the magnetic device is provided with a coil assembly comprising at least one coil (e.g., coil CL as shown in FIG. 5), wherein the coil is constructed and arranged within a magnetic circuit formed by the first magnetic part MP1, the second magnetic part MP2 and the additional magnetic part AMP such that, upon energizing of the coil, an additional force is exerted between the first part FP of the magnetic device and the second part SP of the magnetic device in the reference direction. This may result in an increasing of the total force between the first part FP of the magnetic device and the second part SP of the magnetic device but it may also allow for compensating (e.g., unexpected) fluctuations with respect to an pre-determined force level between the first part FP of the magnetic device and the second part SP of the magnetic device (e.g., a steady-state setting as the magnetic device is used as e.g., a gravity compensator). Furthermore the additional energy-dependent force may be used during leveling or focusing of the substrate. A further advantage of the additional magnetic part AMP is that the magnetic field strength between the first magnetic part MP1 and the second magnetic part MP2 is increased, thereby also increasing the Steepness of the Lorentz force. The Steepness of the Lorentz force is defined as being $F^2/P$, wherein F is the exerted force (in N), and P is the dissipated power (in W) to exert this force. In other words, the increase in magnetic field strength increases the value of the motor constant and thereby increases the exerted force (motor output) for the same current (motor input). The increased value of the motor constant also has the benefit that, for example, the design can be made smaller for generating the same force. In an embodiment, the force between the first part FP of the magnetic device and the second part SP of the magnetic device may be used to compensate for a gravitational force in the reference direction (e.g., the direction corresponding with the z-direction).

According to an embodiment of the invention the magnetic device may be provided for use in the lithographic apparatus of FIG. 1 as, e.g., a gravity compensator. The magnetic device being suitable as a gravity compensator, wherein the reference direction RD is substantially aligned along the axis of gravity enabling that the first force and the second force provide a supporting force between the first part FP of the magnetic device and the second part SP of the magnetic device. In an embodiment at least one of the first magnetic part MP1 and the second magnetic part MP2 is circular symmetric around an axis of symmetry and substantially parallel to the axis of gravity. The first magnetic part MP1 and the second magnetic part MP2 may be donut shaped and the center axis CA may go through the center of the donut (as shown in FIG. 5) or in an alternative embodiment the center axis CA may, in parallel with the reference direction, go through the center of the magnetic part MP1.

Figure 6:
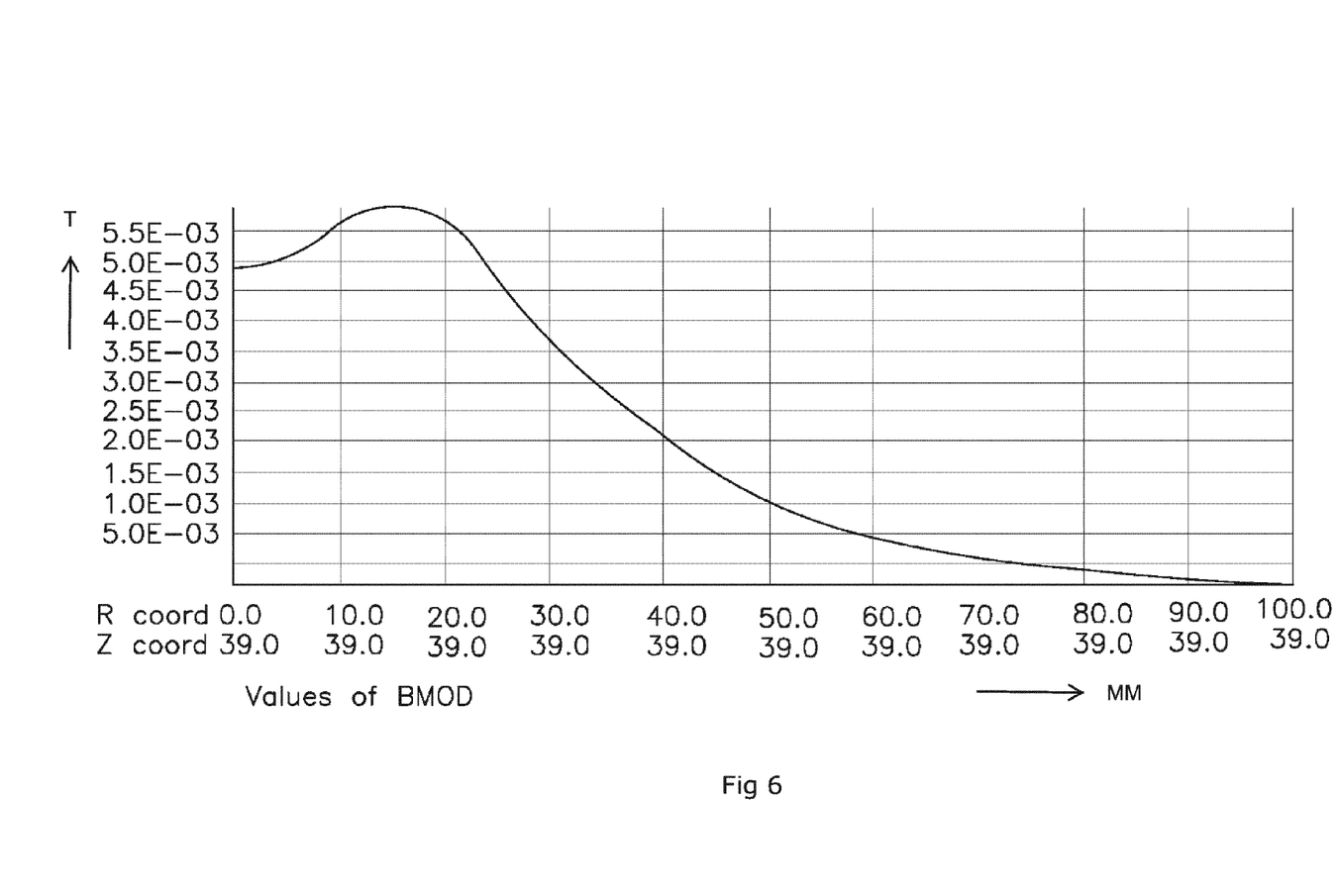
FIG. 6 depicts a graph of the strength of the magnetic field outside the magnetic device of FIG. 5 at a certain level.

The first magnetic part MP1 may create a magnetic field in the reference direction corresponding, for example, with the z-direction. In an embodiment the second magnetic part MP2 may create a magnetic field in the second direction, the second direction being substantially perpendicular to the reference direction and corresponding with the radial direction (i.e., the R-axis of the graph as shown in FIG. 6 representing the radius from the center axis CA of the magnetic device), whereas the reference direction may correspond with the Z-axis. The example in the graph as shown in FIG. 6 represents the distance in R- and z-direction in millimeters.

As depicted in FIG. 5, the magnetic polarization of the second magnetic part MP2 is directed inwards to the center axis CA and towards the first magnetic part MP1. The magnetic polarization of the second magnetic part MP2 may also be directed outwards, for example if the magnetic polarization of the first magnetic part MP1 is directed downwards. As depicted in FIG. 5 two additional magnetic parts AMP11, AMP12 may be provided above and below the first magnetic parts MP1. The additional magnetic parts AMP11, AMP12 may comprise a permanent magnet and may, for example, be made from Neodymium Iron Bohr, Samarium Cobalt or a ceramic material.

FIG. 6 depicts a graph of the strength of the magnetic field at a fixed distance of 39 mm in the z-direction above the magnetic device of FIG. 5 (see the description referring to FIG. 2a and FIG. 3 for more details and explanation about the shown values). The maximum magnetic field at a distance of 39 mm above the magnetic device with the additional magnetic parts AMP11, AMP12 is significantly lower than the maximum magnetic field as described with reference to FIG. 3 and may be in a range between 0 to 6.0 milliTesla.

Figure 7:
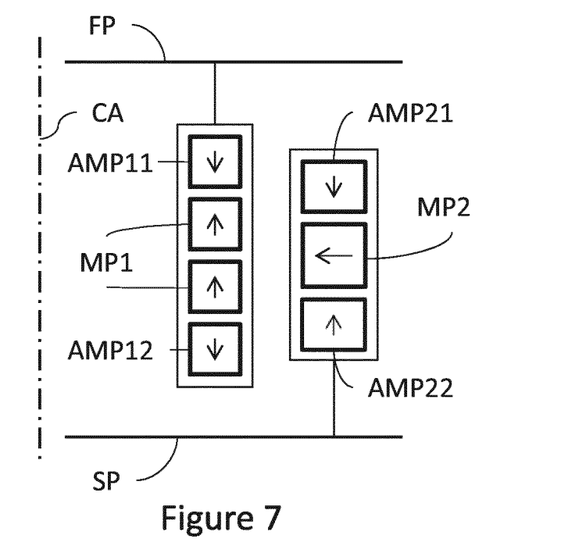
FIG. 7 depicts a magnetic device according to a third embodiment of the invention.

As shown in FIG. 7, second additional magnetic parts AMP21, AMP22 may also be provided to the second magnetic part MP2. In comparison with FIG. 2a, in total two additional magnetic parts AMP11, AMP12 and two second additional magnetic parts AMP21 and AMP22 are added to the magnetic device. The second additional magnetic parts AMP21, AMP22 have a second additional magnetic polarization substantially parallel to the reference direction RD. It may be clear to the skilled person that alternatively, also at least one of the second additional magnetic parts AMP21, AMP22 may be used. Simulations indicate that the total force in the reference direction between the first part FP of the magnetic device and the second part SP of the magnetic device increases with about 240% in comparison with the magnetic device as shown and described with reference to FIG. 2a. Simulations furthermore indicate that the magnetic stray field outside the magnetic device also further reduces due to the addition of the second additional magnetic parts AMP21, AMP22. In an alternative embodiment the first part FP of the magnetic device is provided with at least one magnetic part MP1, whereas at least one of the second additional magnetic parts AMP21, AMP22 is provided to the second part SP of the magnetic device. Simulations indicate that also this alternative magnetic configuration is advantageous regarding increased force between the first part FP of the magnetic device and the second part SP of the magnetic device while this alternative magnetic configuration also provides a reduced magnetic stray field outside the magnetic device in comparison with the prior art configuration as described with reference to FIG. 2a.

Figure 8:
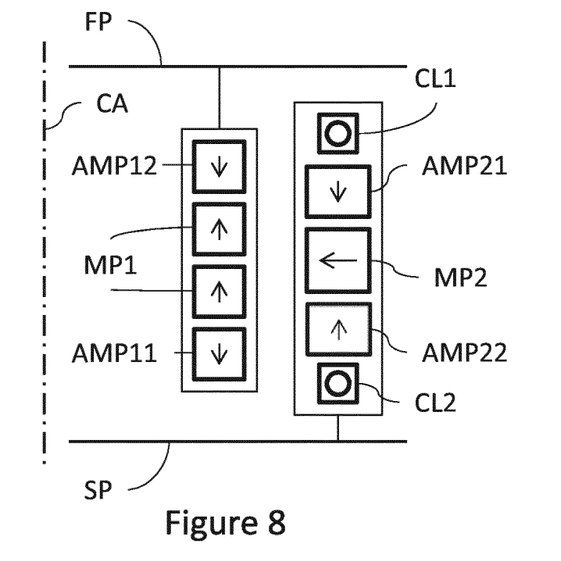
FIG. 8 depicts a magnetic device according to a fourth embodiment of the invention.

The configuration as shown and described with reference to FIG. 7 may furthermore be extended by adding at least one of the coils CL1, CL2 as shown in FIG. 8. As the magnetic flux density at the position of the coils CL1, CL2 is furthermore increased by the applied magnetic configuration, providing at least one of the coils CL1, CL2 for generating an additional force between the first part FP of the magnetic device and the second part SP of the magnetic device becomes even more efficient as the Steepness of the integrated Lorentz actuator also increases.

Figure 9:
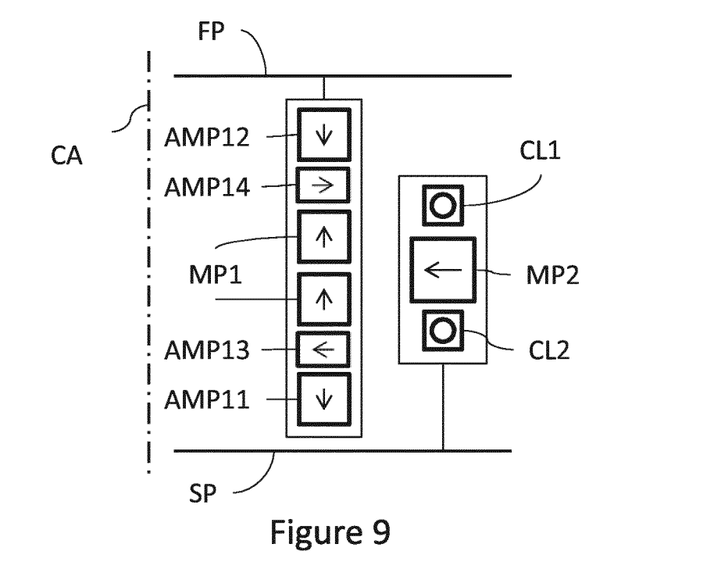
FIG. 9 depicts a magnetic device according to a fifth embodiment of the invention.

In FIG. 9, a magnetic device according to a fifth alternative embodiment of the invention is shown. In this configuration third additional magnetic parts AMP13, AMP14 are being radially magnetized (i.e., having a third magnetic polarization being substantially perpendicular to the reference direction) are added in between the first magnetic parts MP1 and the additional magnetic parts AMP11, AMP12. This results in a further improvement of the Steepness of the Lorentz actuator and in an increase of the total force between the first part FP of the magnetic device and the second part SP of the magnetic device in the reference direction. In the configuration as shown in FIG. 9, the second additional magnetic parts AMP21, AMP22 are omitted for simplicity, but these second additional magnetic parts can be added in a further alternative magnetic device configuration. In an alternative embodiment at least one of the coils CL1, CL2 can be omitted to create a (more) passive magnetic device.

Figure 10:
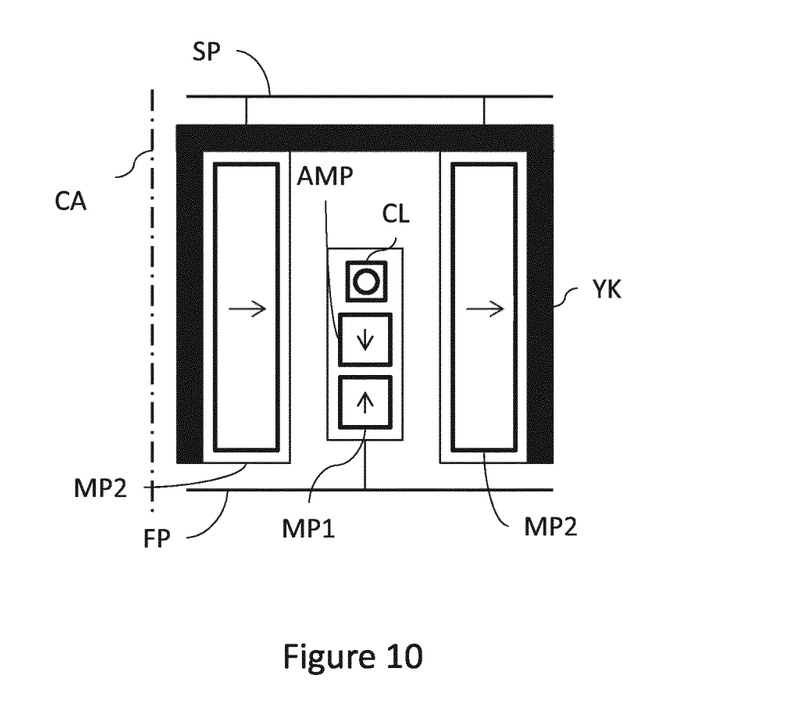
FIG. 10 depicts a magnetic device according to a sixth embodiment of the invention.

FIG. 10, shows a magnetic device according to a sixth alternative embodiment of the invention. In this configuration a stator (i.e. the part that is substantially stationary) is connected to the second part SP of the magnetic device and comprises a second magnetic part MP2 that is mounted to a magnetic yoke YK that is being constructed and arranged to guide the magnetic flux in the magnetic circuit of the magnetic device. A rotor (i.e. the part that is relatively movable with respect to the stator) is connected to the first part FP of the magnetic device and comprises a first magnetic part MP1, an additional magnetic part AMP and a coil CL. It is noted that the first part FP of the magnetic device is located below the second part SP of the magnetic device, and consequently the first part FP of the magnetic device is actually hanging below the second part SP of the magnetic device and is kept at position by the first force and the second force. In an embodiment the magnetic device may be used to support a liquid confinement system. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, a seal is formed between the liquid confinement structure and the surface of the substrate and may be a contactless seal such as a gas seal. Such a system is disclosed in United States patent application publication no. US 2004-0207824. In an embodiment the magnetic device may function as a gravity compensator in combination with a Lorentz actuator. The gravity compensator function is realized by the first magnetic part MP1 that is configured to magnetically interact with the second magnetic part MP2. The additional magnetic part AMP is added to obtain a more constant force over a certain stroke of the rotor. The dimensions of the first and second magnetic parts MP1, MP2 and additional magnetic part AMP determine the force between the first part FP of the magnetic device and the second SP part of the magnetic device. The inventors have found out that the height ratio of the magnetic parts MP1, MP2 at least partly determine the force deviation in dependency of the stroke of the rotor in the reference direction RD. By varying the height of the additional magnetic part AMP it is possible to control the value and the sign of stiffness in the reference direction that needs at least partly to be compensated by energizing the coil CL. The effect of the additional magnetic part AMP is that it linearizes non-linear behavior of the first magnetic part MP1 while magnetically interacting with the second magnetic part MP2. This is advantageous as the coil CL also allows the magnetic device to function as a Lorentz actuator and consequently the function of a gravity compensator and actuator can be combined in one magnetic device which may reduce the required volume compared with e.g., a situation wherein the gravity compensator function and the Lorentz actuator function are physically separated. In an embodiment of the invention the permanent magnets are substantially free from ferromagnetic materials.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A magnetic device, comprising:
a first part;
a second part;
a first magnetic part coupled to the first part and having a first magnetic polarization;
a second magnetic part coupled to the second part and having a second magnetic polarization; and
an additional magnetic part coupled to the first part and having an additional magnetic polarization;
wherein:
the first magnetic part and the second magnetic part are configured to magnetically interact with each other, wherein:
the first magnetic part exerts a first force on the second magnetic part;
the second magnetic part exerts a second force on the first magnetic part; and
the first force and the second force have opposite directions that are parallel to a reference direction;
the first magnetic polarization is substantially parallel to the reference direction;
the second magnetic polarization is substantially perpendicular to the reference direction;
the additional magnetic polarization makes an angle with the first magnetic polarization; and
wherein the angle has a magnitude of about 180°.

2. The magnetic device of claim 1, wherein at least one of the first part and the second part is provided with a coil assembly comprising at least one coil, wherein the coil is constructed and arranged within a magnetic circuit formed by the first magnetic part, the second magnetic part and the additional magnetic part such that, upon energizing of the coil, an additional force is exerted between the first part and the second part in the reference direction.

3. The magnetic device of claim 1, wherein the additional magnetic part comprises a permanent magnet that is substantially free from ferromagnetic material.

4. The magnetic device of claim 1, further comprising a second additional magnetic part being coupled to the second part and wherein the second additional magnetic part has a second magnetic polarization being substantially parallel to the reference direction.

5. The magnetic device of claim 1, further comprising a third additional magnetic part being coupled to the first part and wherein the third additional magnetic part has a third magnetic polarization being substantially perpendicular to the reference direction.

6. The magnetic device of claim 5, wherein the third additional magnetic part is located in between the first magnetic part and the additional magnetic part.

7. The magnetic device of claim 1, being suitable as a gravity compensator, wherein the reference direction is substantially aligned along the axis of gravity enabling that the first force and second force provide a supporting force between the first part and the second part.

8. The magnetic device of claim 7, wherein at least one of the first magnetic part and the second magnetic part is circular symmetric around an axis of symmetry and substantially parallel to the axis of gravity.

9. A lithographic apparatus comprising:
a support structure configured to support a patterning device, the patterning device configured to pattern a radiation beam to form a patterned beam of radiation;
a substrate table configured to support a substrate;
a projection system configured to project the patterned beam of radiation onto the substrate; and
a magnetic device of claim 1.

10. The lithographic apparatus of claim 9, wherein the first part of the magnetic device is accommodated at the substrate table, the support structure or a liquid confinement system.

* * * * *